(12) United States Patent
Carter-Coman et al.

(10) Patent No.: US 6,222,207 B1
(45) Date of Patent: Apr. 24, 2001

(54) DIFFUSION BARRIER FOR INCREASED MIRROR REFLECTIVITY IN REFLECTIVE SOLDERABLE CONTACTS ON HIGH POWER LED CHIP

(75) Inventors: Carrie Carter-Coman, San Jose; Gloria Hofler, Sunnyvale; Fred A. Kish, Jr., San Jose, all of CA (US)

(73) Assignee: LumiLeds Lighting, U.S. LLC, San Jose, CA (US)

( * ) Notice: Subject to any disclaimer, the term of this patent is extended or adjusted under 35 U.S.C. 154(b) by 0 days.

(21) Appl. No.: 09/317,647

(22) Filed: May 24, 1999

(51) Int. Cl.[7] ................................................. H01L 33/00
(52) U.S. Cl. ............................. 257/98; 257/79; 257/81; 257/82; 257/91; 257/99
(58) Field of Search ................................. 257/91, 98, 99, 257/79, 81, 82

(56) References Cited

U.S. PATENT DOCUMENTS

| | | | |
|---|---|---|---|
| 4,210,389 | 7/1980 | Burkhart et al. | 350/321 |
| 4,990,970 | * 2/1991 | Fuller | 357/11 |
| 5,055,893 | * 10/1991 | Sasagawa | 357/17 |
| 5,132,750 | * 7/1992 | Kato et al. | 357/17 |
| 5,237,581 | * 8/1993 | Asada et al. | 372/45 |
| 5,414,281 | * 5/1995 | Watanbe | 257/95 |
| 5,460,911 | * 10/1995 | Yu et al. | 430/64 |
| 5,537,433 | * 7/1996 | Fuller | 372/45 |
| 6,111,272 | 8/2000 | Heinen | 257/94 |

FOREIGN PATENT DOCUMENTS 0 905 797 A2    3/1999    (EP) .

OTHER PUBLICATIONS

G.E. Hofler et al., "High–flux high–efficiency transparent–substrate AlGaInP/GaP light–emitting diodes," Electronic Letters, vol. 34, No. 18, Sep. 3, 1998, pp. 1–2.

* cited by examiner

Primary Examiner—Matthew Smith
Assistant Examiner—Belur Keshavan
(74) Attorney, Agent, or Firm—Skjerven Morrill MacPherson LLP; Brian D. Ogonowsky; Rachel V. Leiterman

(57) ABSTRACT

A solderable light-emitting diode (LED) chip and a method of fabricating an LED lamp embodying the LED chip utilize a diffusion barrier that appreciably blocks molecular migration between two different layers of the LED chip during high temperature processes. In the preferred embodiment, the two different layers of the LED chip are a back reflector and a solder layer. The prevention of intermixing of the materials in the back reflector and the solder layer impedes degradation of the back reflector with respect to its ability to reflect light emitted by the LED. The LED chip includes a high power AlInGaP LED or other type of LED, a back reflector, a diffusion barrier and a solder layer. Preferably, the back reflector is composed of silver (Ag) or Ag alloy and the solder layer is made of indium (In), lead (Pb), gold (Au), tin (Sn), or their alloy and eutectics. In a first embodiment, the diffusion layer is made of nickel (Ni) or nickel-vanadium (NiV). In a second embodiment of the invention, the diffusion barrier is made of titanium-tungsten-nitride (TiW:N). In addition to preventing the intermixing of the In of the solder layer with the Ag of the back reflector, the diffusion layer prevents degradation of the Ag reflective properties in the back reflector upon exposure to air. In an alternative embodiment, the diffusion layer is made of a non-conductive material.

23 Claims, 4 Drawing Sheets

DIFFUSION BARRIER FOR INCREASED MIRROR REFLECTIVITY IN REFLECTIVE SOLDERABLE CONTACTS ON HIGH POWER LED CHIP

TECHNICAL FIELD

The invention relates generally to light-emitting diode lamps and more particularly to a light-emitting diode chip having a back reflector.

DESCRIPTION OF THE RELATED ART

Light-emitting diode (LED) lamps utilize LED chips that are attached to lead frames which conduct excitation signals to initiate the generation of light. LEDs are well-known solid state devices that can emit light having a predefined spectral distribution. LEDs are widely used as illuminators, indicators and displays. In a typical LED lamp, the LED chip includes a layer of epoxy that bonds the LED chip to the lead frame during a die attach process.

Some types of conventional LEDs have semiconductor layers which are transparent to the emitted light and are located between the active layer and the lead frame. Such is the case for InGaN on sapphire, Transparent Substrate-AlInGaP (AlInGaP wafer bonded to a transparent GaP substrate) and GaP LEDs, which all have substrates that are transparent to the emitted light.

A concern with conventional LED lamps is that a significant amount of emitted light from the LED chip may be absorbed by the underlying material, which lowers the light output power (LOP) of the lamp. A typical method of alleviating this concern is to include silver (Ag) in the layer of epoxy on the LED chip, with the Ag functioning as a reflector. With the inclusion of Ag in the epoxy layer, some of the light that would have been absorbed by the underlying material is reflected by the Ag and is emanated from the LED chip as output light, thereby increasing the LOP of the lamp.

However, a high power LED chip recently developed by Hewlett-Packard Company, the assignee of the invention disclosed herein, requires a bonding layer and package that has a much lower thermal resistance than the epoxy/Ag layer. The high power LED chip is described in an article entitled "High-flux high-efficiency transparent-substrate AlGaInP/GaP light-emitting diodes," by G. E. Höfler et al., *Electronic Letters*, Sep. 3, 1998, Vol. 34, No. 18. The high power LED chip utilizes a layer of soldering material, instead of the epoxy/Ag layer, to bond the LED chip to a lead frame or a die pad, which also serves as a heat sink. Preferably, the soldering material has a low thermal resistance to lower the operating temperature of the LED chip, which improves light output and reliability. In addition, the high power LED chip includes a layer of reflective material to function as a reflector that increases the LOP of the lamp embodying the high power LED chip. The reflective material is chosen such that the reflector has a high reflectivity with respect to emitted wavelengths (>80%) and has a good thermal conductivity.

In FIG. 1, a high power LED chip 10 having an LED 12 and a layer 14 of soldering material is shown. The LED is an AlInGaP LED having an active layer 16, where light is generated in response to applied electrical energy. The generated light is emitted in all directions, as illustrated by the arrows near the active layer. Attached to the lower surface of the LED is ohmic contact 18. The ohmic contact is covered by an Ag reflector 20. The high power LED chip 10 also includes an ohmic contact 21, located on the upper surface of the LED. When the LED is operating, some of the light generated by the active layer of the LED propagates away from the lower ohmic contact, emanating from the LED as output light 22. However, some of the light propagates toward the ohmic contact. A portion of this light impinges the lower ohmic contact 18 and may be absorbed. Another portion of this light, however, impinges the Ag reflector, which operates to reflect the impinging light out of the chip. Thus, the intensity of the output light is increased by the light reflected from the Ag reflector.

The Ag reflector is located between the LED and the solder layer 14. The soldering material in the solder layer is indium (In). The solder layer allows the LED chip to be attached, or bonded, to an external surface (not shown).

During a high temperature process, such as a die attach process which is performed at a temperature above the melting point of the solder layer 14 (for In, the melting point is approximately 156 degrees Celsius), the Ag reflector 20 and the In solder layer 14 can intermix, reducing the reflectivity of the Ag reflector from approximately 95% to approximately less than 70%. This results in an LOP reduction of approximately 15%–20% in packaged devices.

Therefore, what is needed is a solderable high power LED chip that includes a reflector that results in high reflectivity, even after the LED chip has been subjected to high temperature processes, such as the die attach process.

SUMMARY OF THE INVENTION

A solderable light-emitting diode (LED) chip and a method of fabricating an LED lamp embodying the LED chip utilize a diffusion barrier that prevents appreciable intermixing of two different layers of the LED chip during high temperature processes. The diffusion barrier is formed of a material that appreciably blocks migration between the two layers of concern when the layers are subjected to an elevated temperature. In the preferred embodiment, the two different layers of the LED chip are a back reflector and a solder layer. By preventing the intermixing of the materials of the back reflector and the solder layer, the diffusion barrier functions to impede degradation of the back reflector with respect to its ability to reflect light emitted by the LED. The diffusion barrier should block migration into and intermixing of the solder layer into the reflector such that the reflectivity of the reflective layer is not appreciably reduced (i.e., more than 10% decrease in reflectivity) at the surface between the reflector and the LED chip. The diffusion barrier should maintain structural integrity, i.e. remain a barrier to diffusion, even at the elevated temperatures necessary to melt the solder layer.

In a first embodiment of the invention, the LED chip includes a high power AlInGaP LED. However, the type of LED included in the LED chip is not critical to the invention. Any LEDs with semiconductor layers transparent to the emitted light, located between the active layer and the solder, would benefit from this invention. Attached to the back surface of the LED is a back reflector. The back surface is the surface opposite to the light-emitting surface of the LED. Preferable for AlInGaP LEDs, the back reflector is composed of silver (Ag) or Ag alloy that has been sputtered on the back surface of the LED. However, the reflector should be optimized for the wavelength of the emitted light. Good reflectors will have reflectivity >90%. Examples of other reflectors include Al or Ag for AlGaN and Au for transparent substrate-AlGaAs LEDs. The back reflector may be formed by evaporation, electroplating, or other suitable techniques. Situated adjacent to the back reflector is the diffusion layer. In this embodiment, the diffusion layer is made of nickel (Ni) or nickel-vanadium (NiV). If the back reflector is sputtered, NiV is preferred over Ni since the NiV can be sputtered on the back reflector. The use of a sputtering process to form the diffusion barrier allows the back reflector and the diffusion barrier to be formed in a single fabrication system. Alternatively, the diffusion barrier may be formed by evaporating or electroplating Ni.

The LED chip also includes a solder layer that is affixed to the diffusion layer, such that the back reflector and the solder layer are separated by the diffusion layer. The solder layer may be made of indium (In), lead (Pb), gold (Au), tin (Sn) or their alloy and eutectics. The solder layer allows the LED chip to be mounted on an integrated heat sink, also known as the slug, or a die pad during a die attach process. The die attach process involves melting the solder layer of the LED chip to physically bond the LED chip to the slug or the die pad. However, the die attach process involves exposing the back reflector, the diffusion barrier and the solder layer to a temperature above the melting point of the soldering material (for In, the melting point is approximately 156 degrees Celsius). The diffusion barrier prevents intermixing of the In of the solder layer with the Ag of the back reflector during this high temperature process. This feature of the diffusion barrier prevents contamination of the back reflector, thereby protecting the back reflector from degradation of its high reflective characteristic. In addition to preventing intermixing of the materials, the diffusion barrier prevents degradation of the Ag in the reflector upon exposure to air.

The thickness of the diffusion barrier should be approximately 500–20,000 Angstroms. The preferred thickness of the diffusion barrier is approximately 2,000–15,000 Angstroms for Ni and approximately 1,000–10,000 Angstroms for NiV. The lower limit of the preferred thicknesses is chosen to ensure that the diffusion barrier can effectively prevent the In/Ag intermixing, while the upper limit is chosen to prevent delamination and reliability issues caused by excess stresses in the film. The difference in the preferred thickness of the Ni and NiV is due to differences in grain size, grain shape and stresses of the films.

In a second embodiment of the invention, the LED chip includes the same components of the LED chip in accordance with the first embodiment. However, in the second embodiment, the diffusion barrier is made of titanium-tungsten-nitride (TiW:N), instead of Ni or NiV. Similar to the Ni or NiV diffusion barrier of the first embodiment, the TiW:N diffusion barrier prevents intermixing of the In of the solder layer with the Ag of the back reflector and also prevents degradation of the Ag in the back reflector upon exposure to air.

Refractory metals, such as molybdenum (Mo), tungsten (W) and tantalum (Ta) may also be used to form a diffusion barrier. However, the melting point of these materials is very high ($T_m$=2610, 3410 and 2996° C., respectively, compared to Ni, $T_m$=1455° C.) and therefore, they are more difficult to deposit and cannot be evaporated.

In an alternative embodiment, the diffusion barrier is made of a non-conductive material. In this embodiment, the diffusion barrier may be made of dielectrics, such as aluminum-oxide ($Al_yO_x$), silicon-oxide ($SiO_x$), silicon-nitride ($SiN_x$), or silicon-oxygen-nitride ($SiO_xN_y$). Dielectrics are materials that have much higher resistivities ($\rho$) than metals or semiconductors (for example, for $Al_2O_3 \rho$= $1\times10^{11}$ ohm-cm, whereas for Si and Ni $\rho$=3 ohm-cm and $6\times10^{-6}$ ohm-cm, respectively). The resulting diffusion barrier forms a non-conductive barrier between the reflector and the solder layer that inhibits flow of electricity, in addition to preventing the intermixing of the reflective material of the reflector and the soldering material of the solder layer. However, thermal resistance of the LED is still important and should not appreciably increase with the addition of the diffusion barrier. A good estimate is not more than a 10% increase in the thermal resistance of the packaged LED should be seen with the addition of the barrier layer.

The non-conductive diffusion barrier is applicable to an LED structure that contains layers transparent to emitted light and located between the active layer and the solder layer, but does not need to conduct electricity. Such is the case for InGaN LEDs grown in sapphire. A non-conductive barrier will have resistivity many times larger than the resistivity for conductive materials. For instance, the resistivity for aluminum oxide ($Al_2O_3$) and silicon oxide ($SiO_x$) are $3\times10^{19}$ and $1\times10^{21}$ $\mu$ohm-cm, respectively, compared to Ni which has a resistivity of 8 $\mu$ohm-cm. The resistivities for the refractory metals are much lower than those for the other non-conductive barriers listed above. Even LEDs that do not require current conduction through the barrier, however, may also utilize conductive diffusion barriers, thereby increasing the choice of materials that can be used to form the diffusion barrier.

A method of fabricating a high power LED lamp in accordance with the invention includes a step in which a layer of reflective material is deposited over the back surface of an LED. The layer of reflective material forms the back reflector of the LED chip that will be embodied in the lamp. In the preferred embodiment, the reflective material is Ag or Ag alloy, which may be sputtered on the back surface of the LED. However, other comparable reflective material may be used to form the back reflector. Next, a diffusion barrier is formed over the back reflector, such that the back reflector is positioned between the LED and the diffusion barrier. In one embodiment, the diffusion barrier is composed of Ni or NiV. In an alternative embodiment, the diffusion barrier is composed of TiW:N. A layer of soldering material is then deposited on the diffusion barrier, so that the back reflector is physically separated from the layer of soldering material by the diffusion barrier. The soldering material may be indium (In), lead (Pb), gold (Au), tin (Sn), or their alloy and eutectics. Next, the LED chip with the back reflector, the diffusion layer and the layer of soldering material is placed on a die platform, such as a slug, a die pad, or a lead frame, such that the layer of soldering material is in contact with the die platform. The LED chip is then attached to the die platform by melting the layer of soldering material, so that the soldering material bonds to the surface of the slug. After the LED chip has been mounted on the die platform, other conventional fabrication steps are performed to complete the high power LED lamp.

An advantage of the invention is that a 13–21% increase in the light output power of the LED lamp can be achieved by including the diffusion barrier in the LED chip. Furthermore, the diffusion barrier can be formed using the same sputtering or evaporation process that is utilized to form the back reflector.

DETAILED DESCRIPTION

Figure 2:
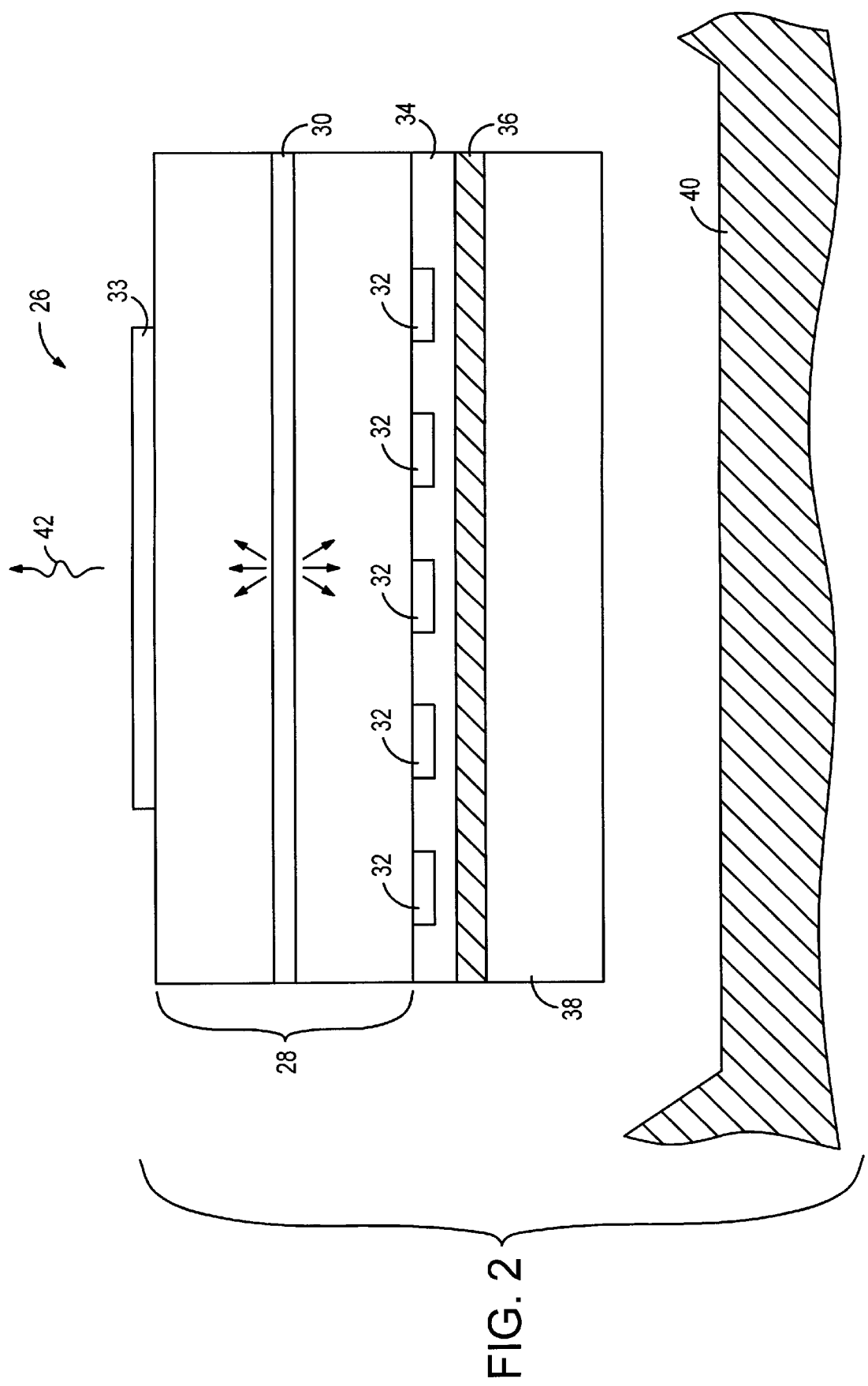
FIG. 2 is a schematic diagram of a solderable high power LED chip in accordance with a first embodiment of the invention.

With reference to FIG. 2, a solderable light-emitting diode (LED) chip 26 in accordance with a first embodiment of the invention is shown. The LED chip includes an LED 28 having an active layer 30. Preferably, the LED is an AlInGaP LED that emits light having a spectral distribution in a range of approximately 550–650 nm. However, the LED 28 may be another type of LED. The type of LED included in the LED chip is not critical to the invention. Any LEDs with semiconductor layers transparent to the emitted light, located between the active layer and the solder, would benefit from this invention. Attached to the lower surface or the back surface of the LED are ohmic contacts 32. The ohmic contacts are within a layer 34 of reflective material, which defines a back reflector of the LED chip. The LED chip also includes an ohmic contact 33, located on the upper surface of the LED. The upper and lower ohmic contacts 32 and 33 provide a well-distributed current to the LED when activated. In the preferred embodiment, the reflective material utilized in the reflector 34 is silver (Ag) or Ag alloy. However, other reflective materials, such as Al and Au, may be utilized to form the reflector. The reflector should be chosen to have reflectivity above ~90% at the emitted light wavelength.

Formed on the back reflector 34 is a diffusion barrier 36. In this embodiment, the diffusion barrier is made of nickel (Ni). The diffusion barrier is positioned between the reflector 34 and a solder layer 38, thereby isolating the reflector from the solder layer. The thickness of the reflector should be approximately 500–20,000 Angstroms. The solder layer may be made of indium (In), lead (Pb), gold (Au), tin (Sn) or their alloy and eutectics. The solder layer allows the LED chip 26 to be mounted on an external die platform 40, such as an integrated heat sink, also known as a slug, a die pad, or a lead frame, during a die attach process. The die attach process involves melting the solder layer of the LED chip to physically bond the LED chip to conductors of the die platform. Unfortunately, the die attach process also involves exposing the back reflector and the diffusion barrier, as well as the solder layer, to a temperature above the melting point of the soldering material (for In, the melting point is approximately 156 degrees Celsius). At such temperature, the soldering material, e.g., the In, of the solder layer can diffuse into the back reflector, in the absence of the diffusion barrier. The diffusion barrier prevents intermixing of the soldering material of the solder layer with the reflective material, e.g., the Ag, of the back reflector during this high temperature process. In addition to preventing intermixing of materials, the diffusion barrier prevents degradation of the Ag in the reflector upon exposure to air. The preferred thickness of the diffusion barrier is approximately 500–20,000 Angstroms. The lower limit of the preferred thickness is chosen to ensure that the diffusion barrier can effectively prevent the In/Ag intermixing, while the upper limit is chosen to prevent delamination and reliability issues caused by excess stresses in the film.

After the LED chip 26 is attached to the die platform 40, and embodied in an LED lamp, the LED chip can be operated to emit light. In operation, the active layer 30 of the LED 28 is excited by applied electrical energy provided by the ohmic contacts 32 and 33. The applied electrical energy induces the active layer to emit light in all directions, as illustrated by the arrows near the active layer. Some of the light propagates upward or out the sides of the LED chip, emanating from the LED as output light 42. However, some of the light propagates in a downward direction toward the solder layer 38. A portion of the downward propagating light impinges upon the ohmic contacts 32, which mostly absorbs the impinging light. However, another portion of the downward propagating light impinges upon the reflector 34. The reflector reflects the impinging light, so that some of the reflected light can eventually exit the LED as output light. Since the reflector is not contaminated with the soldering material from the solder layer during the die attach process, the reflector will have a high reflective characteristic that reflects most of the impinging light. The reflected light, which might otherwise have been lost due to absorption, increases the intensity of the overall output light.

Figure 1:
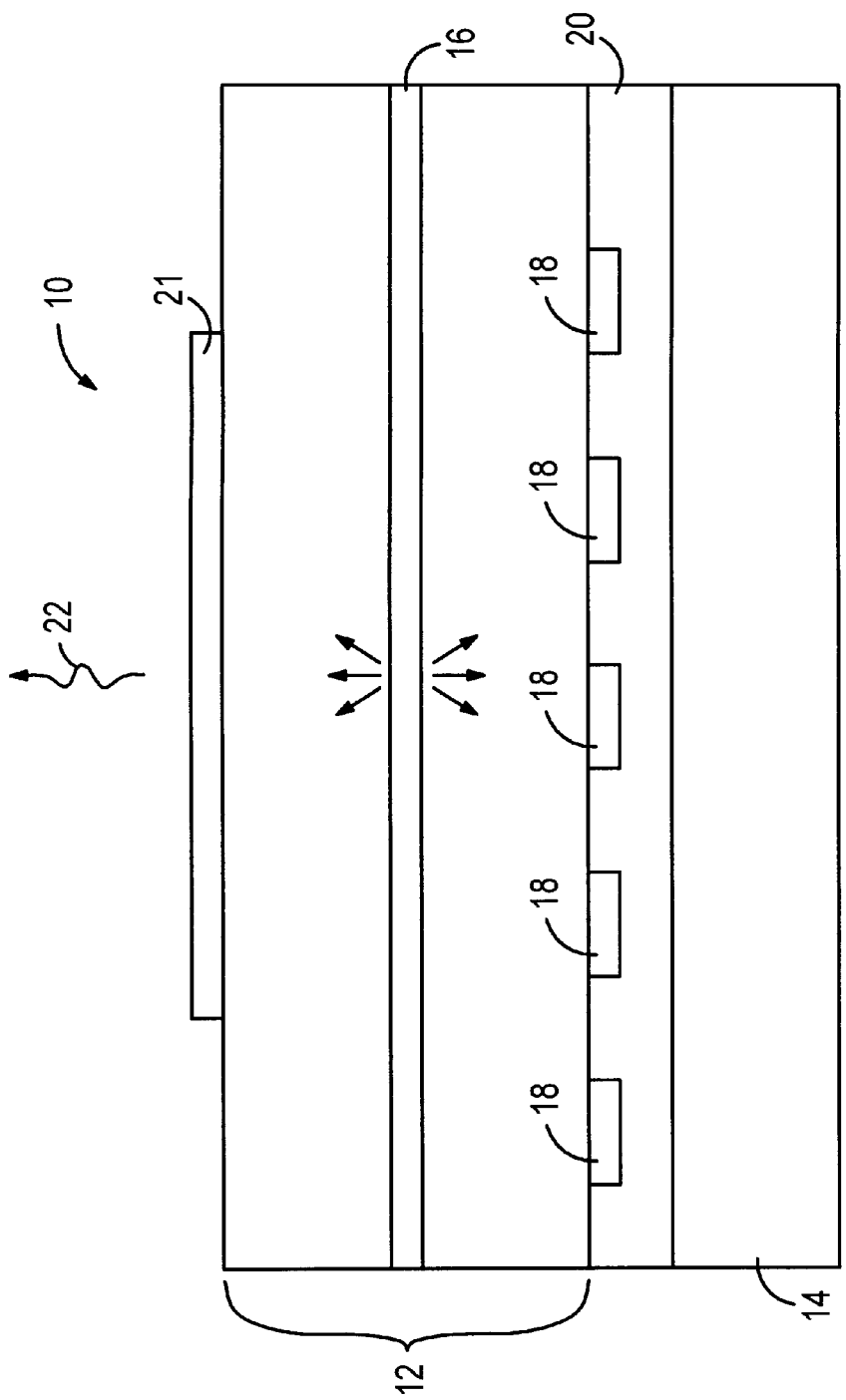
FIG. 1 is a schematic diagram of a prior art high power LED chip having a back reflector and a solder layer.

The inclusion of the Ni diffusion barrier 36 produces LED lamps having approximately 13–21% higher light output power (LOP) than LED lamps embodying the LED chip 10 of FIG. 1. A thicker Ni diffusion barrier yields an LED lamp having a higher LOP gain. A Ni diffusion barrier of 2,000 Angstroms thickness yields a lamp with approximately 13% higher LOP than the conventional high power lamp. A Ni diffusion barrier of 7,000 Angstroms thickness produces a lamp having 17–21% higher LOP. Data indicates that the Ni diffusion barrier does not degrade in temperature shock (TMSK) performance due to extra stresses (TMSK 40–120° air—air, 200 cycles) or high temperature operation life tests.

A disadvantage of using Ni for the diffusion barrier 36 is that different deposition procedures may be required to form the reflector 34 and the diffusion barrier. The reflector may be formed by a number of deposition procedures, such as sputtering, evaporation, and electroplating. However, the Ni diffusion barrier is typically formed by an evaporation process, though it can be electroplated. The magnetic characteristic of Ni prohibits the use of a sputtering process to deposit Ni to form the diffusion barrier. Therefore, if the reflector is formed by sputtering, a different deposition procedure is required to form the diffusion barrier. One way to overcome this issue is to use nickel-vanadium (NiV), instead of pure Ni. The V prevents the Ni from becoming magnetic, which allows the NiV to be deposited using standard sputtering equipment. The amount of V in the NiV is relatively small in comparison with Ni. As an example, the NiV may have approximately 7% V and approximately 93% Ni. The preferred thickness of NiV to form the diffusion barrier 36 is approximately 1,000–10,000 Angstroms. The difference in the preferred thickness of the NiV diffusion barrier to the Ni diffusion barrier is due to differences in grain size and stresses of the films. The NiV allows the same sputtering equipment to be utilized for depositing Ag to form the reflector and for depositing NiV to form the diffusion barrier.

Figure 3:
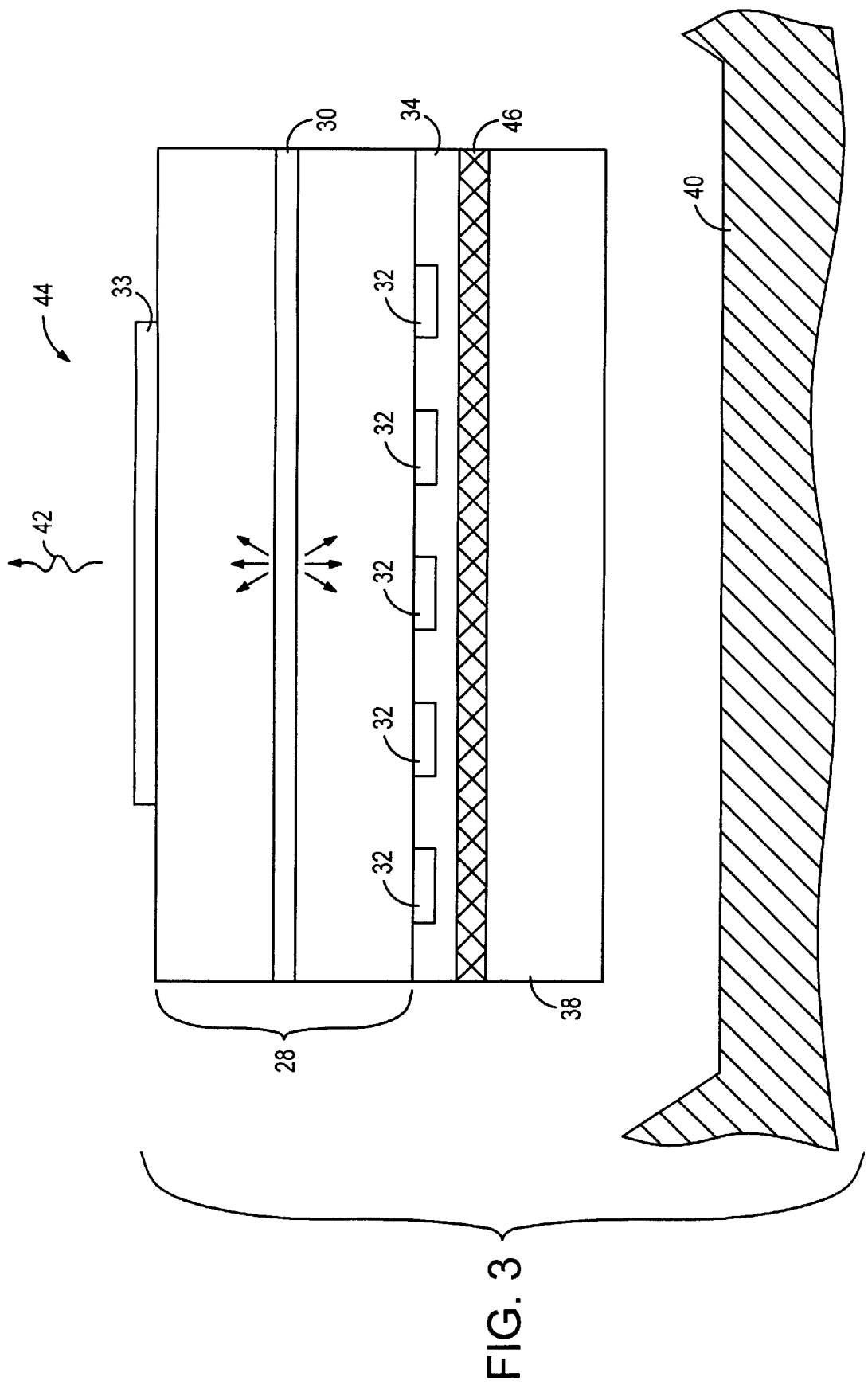
FIG. 3 is a schematic diagram of a solderable high power LED chip in accordance with a second embodiment of the invention.

Turning now to FIG. 3, a solderable high power LED chip 44 in accordance with a second embodiment of the invention is shown. The LED chip 44 is structurally similar to the LED chip 26 of FIG. 2. Therefore, the same reference numerals of FIG. 2 will be used to identify the same components illustrated in FIG. 3. The LED chip 44 includes the LED 28 having the active layer 30, the ohmic contacts 32, the reflector 34 and the solder layer 38. However, unlike the LED chip 26 of FIG. 2, the LED chip 44 includes a titanium-tungsten-nitride (TiW:N) diffusion barrier 46. The TiW:N diffusion barrier may have a thickness of approximately 800 Angstroms or greater. Similar to the Ni diffusion barrier 36 of the LED chip 26, the TiW:N diffusion barrier prevents intermixing of the reflective material, (e.g., Ag) of the reflector and the soldering material, (e.g., In) of the solder layer during a high temperature process, such as a die attach process. Consequently, the reflector is able to maintain its high reflective characteristic. In general, a thicker layer of TiW:N will be a better diffusion barrier. However, the thickness is limited to approximately 10,000 Angstroms, due to excess stress in the film which could cause non-reproducibility and reliability issues. In addition, the effectiveness of the barrier is largely determined by the pinhole density. For films that have a low pinhole density, a thinner layer of TiW:N can be used.

The barrier performance depends on a variety of properties including grain size and shape. Barriers made of Ti up to 4,000 Angstroms thick and TiW up to 1,000 Angstroms thick were also tried. Neither one of these materials provided a 100% barrier to prevent In/Ag intermixing.

A high power lamp embodying the LED chip 44 operates in the same manner as the high power lamp embodying the LED chip 26 of FIG. 2. The active layer 30 of the LED 28 generates light in response to applied electrical energy. The applied electrical energy induces the active layer to emit light in all directions, as illustrated by the arrows near the active layer. Some of the light is emanated from the top and sides of the LED as output light 42. However, some of the light propagates in a downward direction, toward the solder layer 38. A portion of the downward propagating light impinges upon the reflector 34 and is reflected in the upward direction by the reflector. A significant portion of the reflected light travels through the LED and exits as output light, thereby increasing the intensity of the overall output light generated by the LED chip.

An LOP gain of approximately 13% with respect to the LOP of conventional high power LED lamps has been obtained using a TiW:N diffusion barrier 46 of approximately 800 Angstroms thickness. Higher LOP gains are expected with thicker TiW:N diffusion barriers, excluding contamination and stress issues.

In an alternative embodiment, the diffusion barrier is made of a non-conductive material. In this embodiment, the diffusion barrier may be made of dielectrics, such as aluminum-oxide ($Al_yO_x$), silicon-oxide ($SiO_x$), silicon-nitride ($SiN_x$), or silicon-oxygen-nitride ($SiO_xN_y$). The resulting diffusion barrier forms a non-conductive barrier between the reflector and the solder layer that inhibits flow of electricity, in addition to preventing the intermixing of the reflective material of the reflector and the soldering material of the solder layer. However, thermal resistance of the LED is important and should not appreciably increase with the addition of the diffusion barrier. A good estimate is not more than a 10% increase in the thermal resistance of the packaged LED should be seen with the addition of the barrier layer.

The non-conductive diffusion barrier is applicable to an LED structure that contains layers transparent to emitted light, located between the active layer and the solder layer, but does not need electrical conduction through those layers. These LEDs, however, may also utilize conductive diffusion barriers, thereby increasing the choice of materials that can be used to form the diffusion barrier.

Figure 4:
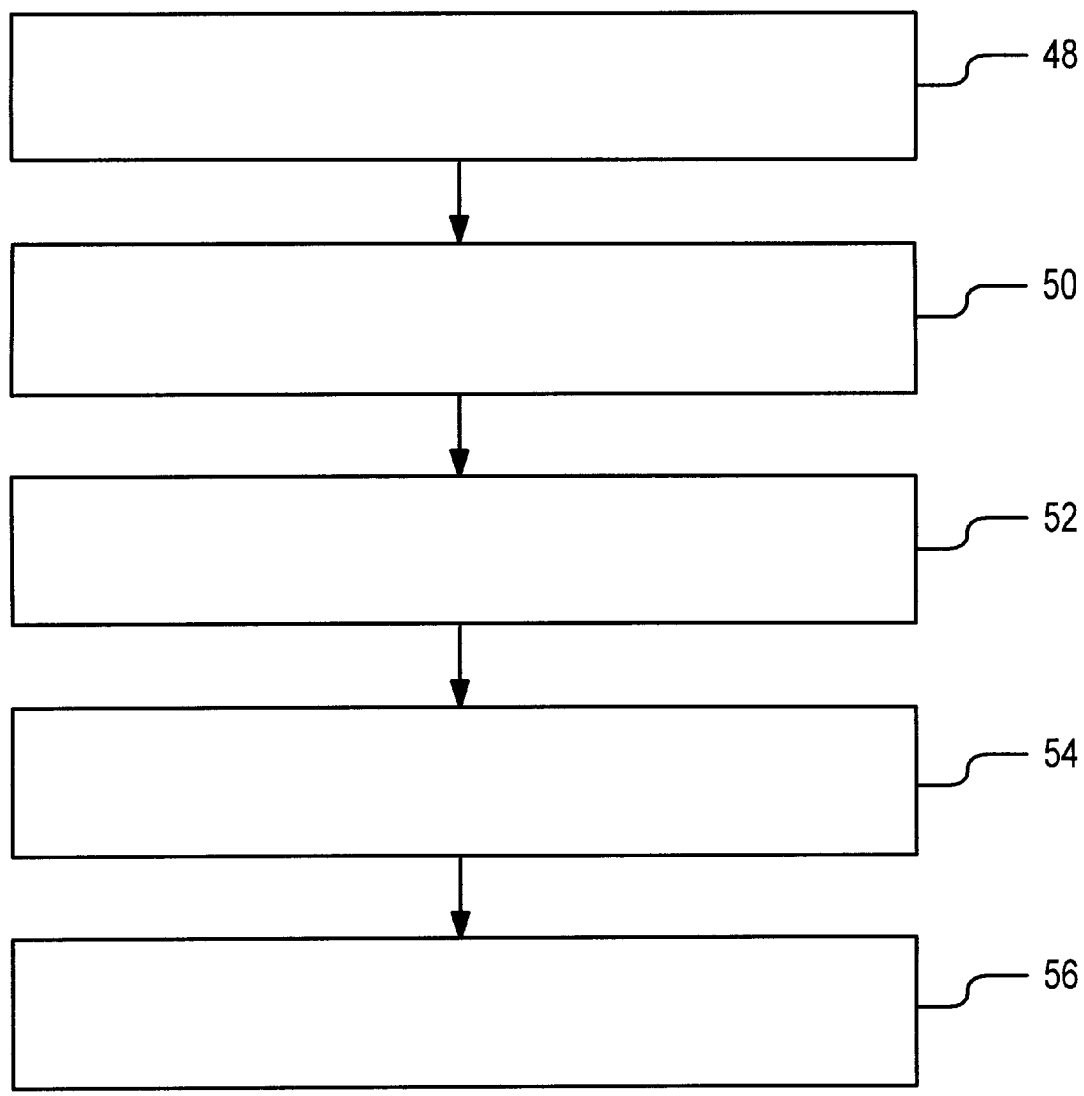
FIG. 4 is a flow diagram of a method of fabricating a high power LED lamp in accordance with the invention.

A method of fabricating a high power LED lamp in accordance with the invention will be described with reference to FIG. 4. At step 48, a layer of reflective material is deposited over a back surface of an LED having ohmic contacts. The back surface is the surface opposite to the light-emitting surface of the LED. The layer of reflective material forms the back reflector of the LED chip that will be embodied in the lamp. In the preferred embodiment, the reflective material is Ag or Ag alloy, which may be sputtered on the back surface of the LED. However, other comparable reflective material may be used to form the back reflector and the choice of the reflective material depends on the wavelength of the emitted light. At step 50, a diffusion barrier is formed over the back reflector, such that the back reflector is positioned between the LED and the diffusion barrier. In one embodiment, the diffusion barrier is composed of Ni or NiV. Preferably, the Ni diffusion barrier has a thickness of approximately 7,000 Angstroms. The NiV has a preferred thickness of approximately 2,000 Angstroms. In an alternative embodiment, the diffusion barrier is composed of TiW:N. In this alternative embodiment, the diffusion barrier may have a thickness of approximately 800 Angstroms or greater.

Next, at step 52, a layer of soldering material is deposited on the diffusion barrier, such that the back reflector is physically separated from the layer of soldering material by the diffusion barrier. The soldering material may be In, Pb, Au, Sn, or their alloy and eutectics. However, a comparable material may instead be utilized. At step 54, the LED chip with the back reflector, the diffusion layer and the layer of soldering material is placed on a die platform, such as a slug, a die pad, or a lead frame, so that the layer of soldering material is in contact with the die platform. The LED chip is then attached to the die platform by melting the layer of soldering material, at step 56, so that the soldering material bonds to the surface of the die platform without intermixing the reflective material of the back reflector with the soldering material. After the LED chip has been mounted on the die platform, other conventional fabrication steps are performed to complete the fabrication of a high power LED lamp.

What is claimed is:

1. A light-emitting structure comprising:
    a light-emitting diode for emitting light generating means having at least one layer that is responsive to an excitation signal
    a reflecting layer coupled to said diode for reflecting a portion of said light emitted from said diode that impinges on said reflecting layer, said reflecting layer including a reflective material such that the layer has a predetermined reflectivity with respect to said light;
    a solder layer on a side of said reflecting layer opposite to said diode for attaching said diode and said reflecting layer to a mounting surface, said solder layer including a solder material that is adherent to said mounting surface; and
    a diffusion barrier positioned between and in contact with both said reflecting layer and said solder layer for isolating said reflecting layer from said solder layer such that said solder material is appreciably blocked from migrating into said reflective material when exposed to high temperatures, said diffusion barrier consisting of a single layer of uniform material composition.

2. The structure of claim 1 wherein said diffusion barrier is made of a conductive material.

3. A light-emitting structure comprising:
    a light-emitting diode for emitting light;
    a reflecting layer coupled to said diode for reflecting a portion of said light emitted from said diode that impinges on said reflecting layer, said reflecting layer including a reflective material such that the layer has a predetermined reflectivity with respect to said light;

a solder layer on a side of said reflecting layer opposite to said diode for attaching said diode and said reflecting layer to a mounting surface, said solder layer including a solder material that is adherent to said mounting surface; and a diffusion barrier positioned between said reflecting layer and said solder layer for isolating said reflecting layer from said solder layer such that said solder material is appreciably blocked from migrating into said reflective material when exposed to high temperatures, said diffusion barrier consisting of a single layer of uniform material composition, said composition including nickel.

4. The structure of claim 3 wherein said composition further includes vanadium.

5. The structure of claim 4 wherein said composition includes approximately 93% nickel and approximately 7% vanadium.

6. The structure of claim 4 wherein said composition has a thickness in the range of 1,000 Angstroms to 10,000 Angstroms.

7. The structure of claim 6 wherein said composition has a thickness of approximately 2,000 Angstroms.

8. The structure of claim 3 wherein said composition consists of nickel.

9. The structure of claim 8 wherein said composition has a thickness in the range of 2,000 Angstroms to 15,000 Angstroms.

10. A light-emitting structure comprising:

a light-emitting diode for emitting light;

reflecting layer coupled to said diode for reflecting a portion of said light emitted from said diode that impinges on said reflecting layer, said reflecting layer including a reflective material such that the layer has a predetermined reflectivity with respect to said light;

a solder layer on a side of said reflecting layer opposite to said diode for attaching said diode and said reflecting layer to a mounting surface, said solder layer including a solder material that is adherent to said mounting surface; and a diffusion barrier positioned between said reflecting layer and said solder layer for isolating said reflecting layer from said solder layer such that said solder material is appreciably blocked from migrating into said reflective material when exposed to high temperatures, said diffusion barrier consisting of a single layer of uniform material composition, said composition including titanium-tungsten-nitride (TiW:N).

11. A light-emitting structure comprising:

a light-emitting diode for emitting light;

a reflecting layer coupled to said diode for reflecting a portion of said light emitted from said diode that impinges on said reflecting layer, said reflecting layer including a reflective material such that the layer has a predetermined reflectivity with respect to said light;

a solder layer on a side of said reflecting layer opposite to said diode for attaching said diode and said reflecting layer to a mounting surface, said solder layer including a solder material that is adherent to said mounting surface; and a diffusion barrier positioned between said reflecting layer and said solder layer for isolating said reflecting layer from said solder layer such that said solder material is appreciably blocked from migrating into said reflective material when exposed to high temperatures, said diffusion barrier consisting of a single layer of uniform material composition, said composition being made of a non-conductive material.

12. The structure of claim 11 wherein said non-conductive material is a dielectric.

13. A light-emitting structure comprising:

a light-emitting diode for emitting light;

a reflecting layer coupled to said diode for reflecting a portion of said light emitted from said diode that impinges on said reflecting layer, said reflecting layer including a reflective material such that the layer has a predetermined reflectivity with respect to said light, said reflective material of said reflecting layer containing silver;

a solder layer on a side of said reflecting layer opposite to said diode for attaching said diode and said reflecting layer to a mounting surface, said solder layer including a solder material that is adherent to said mounting surface, said solder material of said solder layer containing a material selected from a group consisting of indium, lead, gold and tin; and a diffusion barrier positioned between said reflecting layer and said solder layer for isolating said reflecting layer from said solder layer such that said solder material is appreciably blocked from migrating into said reflective material when exposed to high temperatures, said diffusion barrier consisting of a single layer of uniform material composition.

14. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light-emitting diode;

a diffusion barrier attached to a surface of said reflective layer that is opposite to said light-emitting diode, said diffusion barrier being a single layer of uniform material composition; and a solder layer affixed to said diffusion barrier such that said diffusion barrier is positioned between said reflective layer and said solder layer, said solder layer being isolated from said reflective layer by said diffusion barrier.

15. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light-emitting diode;

a diffusion barrier attached to a surface of said reflective layer that is opposite to said light-emitting diode, said diffusion barrier including nickel (Ni); and a solder layer affixed to said diffusion barrier such that said diffusion barrier is positioned between said reflective layer and said solder layer, said solder layer being isolated from said reflective layer by said diffusion barrier.

16. The structure of claim 15 wherein said diffusion barrier further includes vanadium (V).

17. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light-emitting diode;

a diffusion barrier attached to a surface of said reflective layer that is opposite to said light-emitting diode, said diffusion barrier consisting of nickel (Ni); and a solder layer affixed to said diffusion barrier such that said diffusion barrier is positioned between said reflective layer and said solder layer, said solder layer being isolated from said reflective layer by said diffusion barrier.

18. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light emitting diode;

a diffusion barrier attached to a surface of said reflective layer that is opposite to said light-emitting diode, said diffusion barrier including titanium-tungsten-nitride (TiW:N); and a solder layer affixed to said diffusion barrier such that said diffusion barrier is positioned between said reflective layer and said solder layer, said solder layer being isolated from said reflective layer by said diffusion barrier.

19. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light-emitting diode;

a diffusion barrier attached to a surface of said reflective layer that is opposite to said light-emitting diode, said diffusing barrier layer is made of a non-conductive material; and a solder layer affixed to said diffusion barrier such that said diffusion barrier is positioned between said reflective layer and said solder layer, said solder layer being isolated from said reflective layer by said diffusion barrier.

20. The structure of claim 19 wherein said non-conductive material is a dielectric material.

21. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light-emitting diode, said reflective layer containing silver (Ag);

a diffusion barrier attached to a surface of said reflective layer that is opposite to said light-emitting diode; and a solder layer affixed to said diffusion barrier such that said diffusion barrier is positioned between said reflective layer and said solder layer, said solder layer being isolated from said reflective layer by said diffusion barrier, said solder layer containing a material selected from a group consisting of indium (In), lead (Pb), tin (Sn) and gold (Au).

22. A light-emitting diode chip comprising:

a light-emitting diode that emits light having a predefined spectral distribution, said light-emitting diode having a first surface and a light-emanating surface and including ohmic contacts on both surfaces;

a reflective layer integrally attached to said first surface of said light-emitting diode to reflect said light emitted from said first surface of said light-emitting diode such that reflected light is directed to said light-emanating surface of said light-emitting diode;

a diffusion barrier attached to a surface of said reflective layer that is opposite to said light-emitting diode; and a solder layer affixed to said diffusion barrier such that said diffusion barrier is positioned between said reflective layer and said solder layer, said solder layer being isolated from said reflective layer by said diffusion barrier.

23. A light-emitting diode chip comprising:

a light-emitting diode that emits light having a predefined spectral distribution, said light-emitting diode having a first surface and a light-emanating surface;

a reflective layer integrally attached to said first surface of said light-emitting diode to reflect said light emitted from said first surface of said light-emitting diode such that reflected light is directed to said light-emanating surface of said light emitting diode;

a diffusion barrier attached to a surface of said reflective layer that is opposite to said light-emitting diode, said diffusion barrier increasing the thermal resistance of the chip by no more than 10%; and a solder layer affixed to said diffusion barrier such that said diffusion barrier is positioned between said reflective layer and said solder layer, said solder layer being isolated from said reflective layer by said diffusion barrier.

* * * * *